United States Patent [19]

Ueno

[11] Patent Number: 4,907,293
[45] Date of Patent: Mar. 6, 1990

[54] ADJACENT CHANNEL INTERFERENCE SUPPRESSING SYSTEM FOR FM RECEIVER

[75] Inventor: Eizi Ueno, Saitama, Japan

[73] Assignee: Pioneer Electronic Corporation, Tokyo, Japan

[21] Appl. No.: 393,178

[22] Filed: Aug. 14, 1989

[30] Foreign Application Priority Data

Aug. 24, 1988 [JP] Japan ............... 63-110010[U]

[51] Int. Cl.⁴ .............................. H04B 1/10
[52] U.S. Cl. ................... 455/295; 455/296; 455/311
[58] Field of Search ......... 455/220, 225, 235, 295, 455/296, 212, 213, 234, 306, 308, 311, 225; 381/13, 107

[56] References Cited

U.S. PATENT DOCUMENTS

| 3,671,867 | 6/1972 | Shcwarz ............... | 455/296 |
| 4,206,317 | 6/1980 | Kahn .................... | 455/311 |
| 4,249,261 | 2/1981 | Ogita .................... | 455/311 |
| 4,388,731 | 6/1983 | King ..................... | 455/225 |
| 4,498,195 | 2/1985 | Ooi et al. ............ | 455/295 |
| 4,549,312 | 10/1985 | Michaels et al. .... | 455/295 |
| 4,673,982 | 6/1987 | Tam et al. ............ | 455/295 |
| 4,739,518 | 4/1988 | Bickley et al. ....... | 455/295 |

Primary Examiner—Reinhard J. Eisenzopf
Assistant Examiner—Andrew Faile
Attorney, Agent, or Firm—Sughrue, Mion, Zinn, Macpeak & Seas

[57] ABSTRACT

An adjacent channel interference suppressing system for an FM receiver which includes a first detecting device for amplifying and demodulating an intermediate frequency signal which has passed through a wide-band filter; a second detecting device for amplifying and demodulating an intermediate frequency signal which has passed through a narrow-band filter; a level adjusting device for receiving FM detection signals from the first and second detecting devices, and for complementarily and continuously adjusting the levels of the FM detection signals; and a control signal generating device for generating a control signal for controlling the level adjusting device according to the presence or absence of an adjacent channel interference.

11 Claims, 2 Drawing Sheets

ADJACENT CHANNEL INTERFERENCE SUPPRESSING SYSTEM FOR FM RECEIVER

FIELD OF THE INVENTION

This invention relates to an adjacent channel interference suppressing system for an FM receiver.

BACKGROUND OF THE INVENTION

In general, in order to suppress an adjacent channel interference with an FM receiver, the pass band width of the intermediate frequency amplifier stage is decreased; that is, the characteristic curve of selectivity is made sharp so that the radio interference of a station close in broadcast frequency to the aimed (or selected) station is sufficiently eliminated. However, the system is disadvantageous in that the demodulated signal is distorted, and the separation is lowered.

In order to overcome the above-described difficulty in a conventional adjacent channel interference suppressing system for an FM receiver, as shown in FIG. 1, a wide-band filter 3 and a narrow-band filter 4 are provided between a front end 1 and an intermediate frequency amplifier and detector unit 2. Depending on the conditions of adjacent channel interference, the wide-band filter or the narrow-band filter 4 is connected between the front end 1 and the intermediate frequency amplifier and detector unit 2 by means of gang switches 5a and 5b which are operated simultaneously. When there is no adjacent channel interference; i.e., the radio wave condition is good, the wide-band filter 3 is selected by means of the gang switches 5a and 5b so that the demodulated signal has little distortion; that is, the reproduced sound is high in quality. When there is an adjacent channel interference; i.e., the radio wave condition is poor, the narrow-band filter 4 is selected by means of the gang switches 5a and 5b, so that the radio interference of the station which is close in frequency to the aimed (or selected) station is eliminated so that the broadcast signal of the aimed or selected station can be positively received.

In the above-described conventional system either the wide-band filter 3 or the narrow-band filter 4 is merely inserted into the circuit by operating the switches 5a and 5b. Therefore, with the conventional device, the band width cannot be changed smoothly with the different conditions of adjacent channel interference, and the switching of the filters may give a sense of inconsistency to the operator (or listener).

If the circuit is so designed that, in switching the two filters, the intermediate frequency signals of the filters are continuous in wave form, then the sense of inconsistency may be lessened. However, the system is still disadvantageous in that, since the two filters are different in delay time from each other, it is difficult to make the wave forms continuous, and therefore the switching of the filters cannot be conducted without giving a sense of inconsistency to the operator.

SUMMARY OF THE INVENTION

Accordingly, an object of this invention is to provide an adjacent channel interference suppressing system for an FM receiver in which, according to the conditions of adjacent channel interference, the switching of the wide-band filter over to the narrow-band filter and vice-a-versa can be achieved without giving a sense of inconsistency to the operator.

The foregoing object has been achieved according to the present invention by the provision of an adjacent channel interference suppressing system for an FM receiver; which, according to the invention, comprises: first detecting means for amplifying and demodulating an intermediate frequency signal which has passed through a wide-band filter; second detecting means for amplifying and demodulating an intermediate frequency signal which has passed through a narrow-band filter; level adjusting means for receiving FM detection signals from the first and second detecting means, and for complementarily and continuously adjusting the levels of the FM detection signals; and control signal generating means for generating a control signal for controlling the level adjusting means according to the presence or absence of an adjacent channel interference. The level adjusting means outputs the FM detection signal provided by the first detecting means when there is no adjacent channel interference, and outputs the FM detection signal provided by the second detecting means when there is an adjacent channel interference.

In the adjacent channel interference suppressing system of the invention, the first detecting means amplifies and demodulates the intermediate frequency signal which has passed through the wide-band filter, and the second detecting means amplifies and demodulates the intermediate frequency signal which has passed through the narrow-band filter. The FM detection signals outputted by the first and second detecting means are applied to the level adjusting means, where they are complementarily and continuously adjusted in level. The level adjusting means is controlled by the control signal which the control signal generating means produces according to the presence or absence of an adjacent channel interference so as to output the FM detection signal provided by the second detecting means when there is an adjacent channel interference, and to output the FM detection signal provided by the first detecting means when there is no adjacent channel interference.

Therefore, the signal obtained by complementarily and continuously adjusting the wide-band signal and the narrow-band signal is provided at the output terminal of the level adjusting means. Thus, the output band width is controlled according to the conditions of adjacent channel interference, and the switching of a wide-band filter over to the narrow-band filter or vice-a-versa can be achieved without giving a sense of inconsistency to the operator.

PREFERRED EMBODIMENT OF THE INVENTION

One preferred embodiment of this invention will be described with reference to the accompanying drawings.

Figure 1:
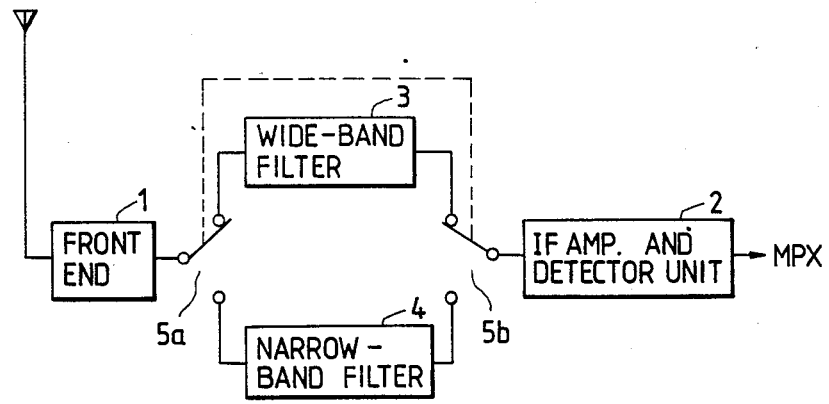
FIG. 1 is a block diagram showing a conventional adjacent channel interference suppressing system for an FM receiver.
Figure 2:
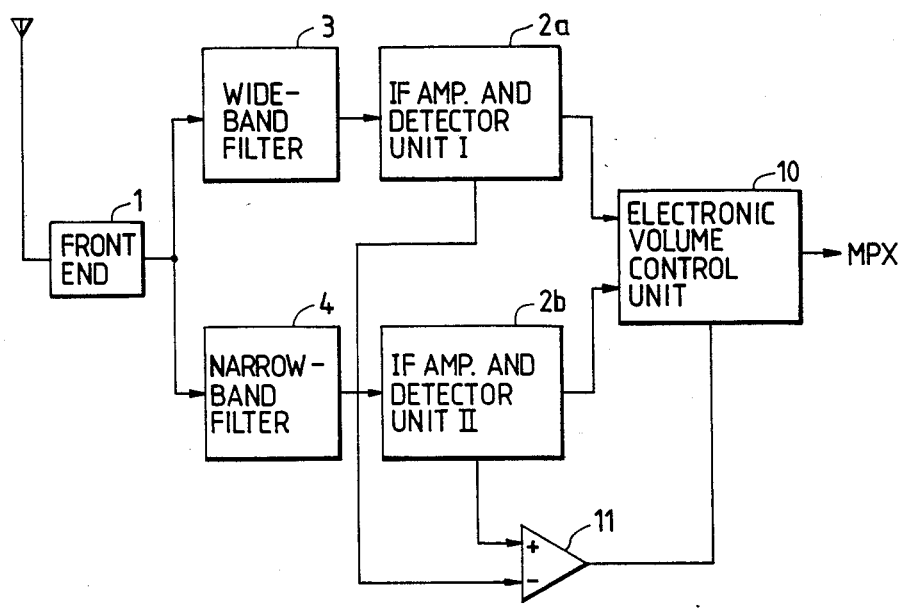
FIG. 2 is a block diagram showing one example of an adjacent channel interference suppressing system for an FM receiver according to the invention.

FIG. 2 is a block diagram showing one example of an adjacent channel interference suppressing system for an FM receiver according to the invention. In FIG. 2, circuit elements functionally corresponding to those which have been already been described with reference to FIG. 1 are designated by the same reference numerals or characters.

As shown in FIG. 2, the output terminal of a front end 1 is connected to the input terminals of a wide-band filter 3 and a narrow-band filter 4, the output terminals of which are connected to the input terminals of first and second intermediate frequency amplifier and detector units 2a and 2b, respectively. The first and second intermediate frequency amplifier and detector units 2a and 2b are equal to each other in characteristic. The units 2a and 2b amplify intermediate frequency signals provided by the wide-band filter 3 and the narrow-band filter 4, and demodulate the intermediate frequency signals thus amplified, to provide composite signals, respectively. The outputs of the intermediate frequency amplifier and detector units 2a and 2b are applied to an electronic volume control unit 10. The unit 10 is adapted to adjust the levels of the output composite signals of the intermediate frequency amplifier and detector units 2a and 2b (hereinafter referred to as "IF amplifier and detector units 2a and 2b", when applicable), and transmit them to a stereo demodulation circuit (MPX).

In the first and second IF amplifier and detector units 2a and 2b, the intermediate frequency signals are subjected to level detection to provide level detection output signals, respectively. The level detection output signals of units 2a and 2b are applied to the positive input terminal and the negative input terminal of a differential amplifier circuit 11, respectively. The differential amplifier circuit 11 operates to output the difference between the level detection output signals applied to its input terminals. The output of the differential amplifier circuit 11 is applied, as a control signal, to the electronic volume control unit 10.

In the case where there is no adjacent channel interference; i.e., the radio wave condition is good, the level detection output signals of the first and second IF amplifier and detector units 2a and 2b are equal to each other in level, and therefore the differential amplifier circuit 11 outputs a low ("L") level signal. The "L" level signal is applied, as a control signal, to the electronic volume control unit 10. In this case, the attenuation of the demodulation signal which is obtained by subjecting the signal passed through the wide-band filter 3 to intermediate frequency amplification and to demodulation in the first IF amplifier and detector unit 2a is minimized, whereas the attenuation of the demodulation signal which is obtained by subjecting the signal passed through the narrow-band filter 4 to intermediate frequency amplification and then to demodulation in the second IF amplifier and detector unit 2b is maximized. Therefore, only the signal that has passed through the wide-band filter 3 is provided at the output terminal of the electronic volume control unit 10. This is equivalent to the fact that the band width of the intermediate frequency amplifier stage is increased, and therefore the amount of distortion in the demodulated signal is decreased.

When, on the the other hand, there is an adjacent channel interference; that is, the radio wave condition is poor, the adjacent channel interference is eliminated by the narrow-band filter 4, and therefore, the level detection output signal of the second IF amplifier and detector unit 2b is equal in level to that provided in the case where there is no adjacent channel interference. However, the output level of the first IF amplifier and detector unit 2b is shifted in one direction, in a positive or negative direction depending on the position of the interfering radio station, because the wide-band filter 3 transmits both the signal of a selected (or desired) radio station and the signal of the interfering radio station. Therefore, the differential amplifier circuit 11 provides an output having a certain level. The output of the circuit 11 is applied, as a control signal, to the electronic volume control unit 10.

In this case, the attenuation of the demodulation signal which is obtained by subjecting the signal that has passed through the narrow-band filter 4 to intermediate frequency amplification and to demodulation in the second IF amplifier and detector unit 2b is minimized, whereas the attenuation of the demodulation signal which is obtained by subjecting the signal that has passed through the wide-band filter 3 to intermediate frequency amplification and then to demodulation in the first IF amplifier and detector unit 2a is maximized. Therefore, only the signal which passed through the narrow-band filter 4 is provided at the input terminal of the electronic volume control unit 210. This is equivalent to the fact that the band width of the intermediate frequency amplifier stage is decreased, and therefore the signal of the selected radio station can be received with the adjacent channel interference eliminated.

When the control signal provided at the output terminal of the differential amplifier circuit 11 is intermediate in value, the electronic volume control unit 10 operates to mix the composite signals of the first and second IF amplifier and detector units 2a and 2b, to provide the output.

Figure 3:
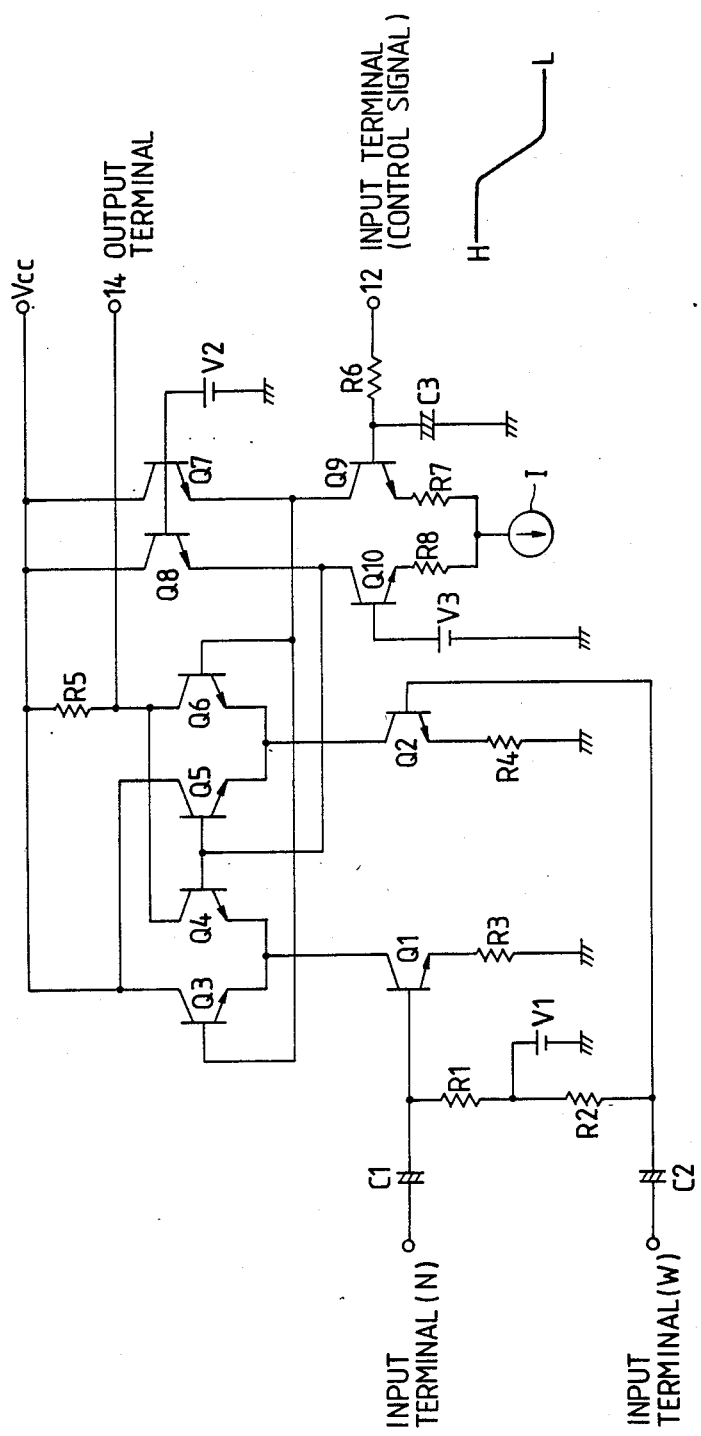
FIG. 3 is a circuit diagram showing an example of an electronic volume control unit in the system of FIG. 2.

FIG. 3 is a circuit diagram showing one example of the electronic volume control unit 10 in FIG. 2. The composite signal which has passed through the narrow-band filter 4 and the second IF amplifier and detector unit 2b is applied to a first input terminal (N) of the electronic volume control unit 10, and the composite signal which passed through the wide-band filter 3 and the first IF amplifier and detector unit 2a is applied to a second input terminal (W) of the unit 10. The output control signal of the differential amplifier circuit 11 is applied to a third input terminal 12 of the unit 10. And the signal provided by adjusting the levels of the composite signals applied to the first and second input terminals is provided at the output terminal 14 of the unit 10.

The first and second input terminals N and W are connected through capacitors C1 and C2 to the bases of transistors Q1 and Q2, respectively. The bases of these transistors Q1 and Q2 are connected respectively through resistors R1 and R2 to a bias voltage source V1 so that they are biased to the same potential. The emitter of the transistor Q1 is grounded through a resistor R3, and the collector is connected to the connecting point of the emitters of transistors Q3 and Q4. Similarly, the emitter of the transistor Q2 is grounded through a resistor R4, and the collector is connected to the connecting point of the emitters of transistors Q5 and Q6. The collectors of the transistors Q4 and Q6 are connected together and then connected through a resistor R5 to a power source Vcc. The connecting point of the resistor R5 and the collectors of the transistors Q4 and Q6 is connected to the output terminal of the electronic volume control unit 10.

The bases of the transistors Q3 and Q6 are connected together and then connected to the emitter of a transistor Q7. Similarly, the bases of the transistors Q4 and Q5 are connected together and then connected to the emitter of a transistor Q8. The emitters of the transistors Q7 and Q8 are connected to the collectors of transistors Q9 and Q10, respectively. The collectors of the transistors Q7 and Q8 are connected to the power source Vcc, and the bases of transistors Q7 and Q8 are connected together and then connected to a bias voltage source V2. The emitters of the transistors Q9 and Q10 are connected respectively through resistors R7 and R8 to a constant current source I. The base of the transistor Q9 is connected through a resistor R6 to the third input terminal 12, and is grounded through a capacitor C3. The base of the transistor Q10 is connected to a bias voltage source V3.

For example, assume that there is no adjacent channel interference, and the control signal applied to the third input terminal 12 is at a "L" level. In this case, the transistors Q3 and Q6 are rendered conductive (on) while the transistors Q4 and Q5 are rendered non-conductive (off), so that only the signal applied to the second input terminal W is provided at the resistor R5; i.e., at the output terminal. When, on the other hand, there is an adjacent channel interference, and the control signal is at "H" level, the transistors Q3 and Q6 are rendered non-conductive (off) while the transistors Q4 and Q5 are rendered conductive (on), so that only the signal applied to the first input terminal (N) is provided at the output terminal. When the level of the control signal is between "H" and "L" levels, depending on the level, the transistors Q3 through Q6 are rendered conductive, so that the signals provided at the first and second input terminals (N and W) are mixed and outputted.

When the level of the control signal is changed from "L" level to "H" level, the base potential of the transistor Q9 is gradually increased according to the time constant defined by the resistor R6 and the capacitor C3. As a result, the transistors Q4 and Q5 are gradually rendered non-conductive (off) while the transistors Q3 and Q6 are gradually rendered conductive (on). It goes without saying that, when the level of the control signal is changed from "H" level to "L" level, the operation is carried out in the same manner. Thus, the output signal of the electronic volume control unit 10 is switched complementarily and continuously between wide band and narrow band. That is, the switching of the wide and narrow bands is carried out, giving no sense of incompatibility to the operator.

In the above described embodiment, the control signal is formed from the difference between the level detection output signals (or the signal strength meter voltages) of the wide and narrow bands; however, it may be formed by using noise components, signal strength meter voltage absolute values, or AGC components in signal strength meter voltages.

As was described above, with the adjacent channel interference suppressing device of the invention, the wide-band signal and the narrow-band signal are complementarily and continuously outputted through level adjustment according to the conditions of adjacent channel interference; that is, the signal band width is automatically controlled according to the conditions of adjacent channel interference. Thus, the switching of the wide and narrow bands can be achieved smoothly without giving a sense of inconsistency to the operator.

What is claimed is:

1. An adjacent channel interference suppressing system for an FM receiver, comprising:

a wide-band filter for receiving an intermediate frequency signal;

a narrow band filter for receiving the intermediate frequency signal;

first detecting means for amplifying and demodulating the intermediate frequency signal which has passed through the wide-band filter;

second detecting means including a narrow-band filter for amplifying and demodulating the intermediate frequency signal which has passed through the narrow-band filter;

control signal generating means responsive to first outputs from said first and second detecting means for generating a control signal dependent upon the difference in the level of signals passed through said wide-band and narrow-band filters; and level adjusting means connected to receive second outputs from said first and second detecting means and responsive to said control signal from said control signal generating means for combining the second outputs from said first and second system means in a proportion dependent upon said control signal.

2. The adjacent channel interference suppressing system defined in claim 1, wherein said first outputs of said first and second detecting means represent levels of the intermediate frequency signals which have passed through said wide-band filter and said narrow band filter, respectively.

3. The adjacent channel interference suppressing system defined in claim 1, wherein said level adjusting means includes an input terminal for receiving said control signal, first circuit means for receiving said second outputs and for combining said second outputs in a proportion dependent upon said control signal, and second circuit means connected to said input terminal and to said first circuit means, said second circuit means having a defined time constant and operable for supplying said control signal received by said input terminal to said first circuit means according to the defined time constant.

4. The adjacent channel interference suppressing system defined in claim 3, wherein said second circuit means is a RC circuit comprising a resistor and a capacitor, said resistor being connected to said input terminal and to said capacitor.

5. An adjacent channel interference suppressing system comprising:

a wide-band filter for receiving an intermediate frequency signal;

a narrow-band filter for receiving the intermediate frequency signal;

first means, coupled to said wide-band filter, for amplifying and demodulating the output signal from said wide-band filter and for generating a first detection signal in accordance with a level of the output signal from said wide-band filter;

second means, coupled to said narrow-band filter, for amplifying and demodulating the output signal from said narrow-band filter and for generating a second detection signal in accordance with a level of the output signal from said narrow-band filter;

a differential amplifier for receiving the first and second generated detection signals and for generating a control signal in accordance with a difference between the first and second detection signals;

level adjusting means for receiving the outputs of said first and second means, and responsive to said control signal for combining said outputs from said first and second detecting means in a proportion dependent upon said control signal.

6. The adjacent channel interference suppressing system defined in claim 5, wherein said level adjusting means includes an input terminal for receiving said control signal, first circuit means for receiving the output signals from said first and second means and for combining the outputs from said first and second detecting means in a proportion dependent upon said control signal, and second circuit means connected to said input terminal and to said first circuit means, said second circuit means having a defined time constant and operable for supplying the control signal received by said input terminal to said first circuit means according to the defined time constant.

7. The adjacent channel interference suppressing system defined in claim 6, wherein said second circuit means is a RC circuit comprising a resistor and a capacitor, said resistor being connected to said input terminal and to said capacitor.

8. A method of suppressing an adjacent channel interference, comprising the steps of:
splitting an intermediate frequency signal into first and second intermediate frequency singals;
filtering the first and second intermediate frequency signals at wide and narrow bands, respectively;
amplyfing and demodulating each of the filtered first and second intermediate frequency signals;
detecting and comparing the levels of the amplified and demodulated first and second intermediate frequency signals to generate a control signal in accordance with the difference in level; and
mixing the amplified and demodulated first and second intermediate frequency signals in response to the control signal to generate a composite signal having a mixing ratio dependent upon the control signal.

9. The method defined in claim 8, wherein the composite signal is the amplified and demodulated first intermediate frequency signal when the levels of the amplified and demodulated first and second intermediate frequency signals are substantially equal to each other, and is the amplified and demodulated second intermediate frequency signal when the levels are different from each other.

10. The method defined in claim 8, wherein the combining step comprises the step of minimizing the attenuation of the amplified and demodulated first intermediate frequency signal and maximizing the attenuation of the amplified and demodulated second intermediate frequency singal when the difference in level between the amplified and demodulated first and second intermediate frequency signals is below a first predetermined level, and minimizing the attenuation of the amplified and demodulated second intermediate frequency signal and maximizing the attenuation of the amplified and demodulated first intermediate frequency signal when the difference in level therebetween is above a second predetermined level.

11. The method defined in claim 10, wherein the combining step further comprises the step of mixing the amplified and demodulated first and second intermediate frequency signals in the mixing ratio dependent upon the level of the control signal when the difference in level between the amplified and demodulated first and second intermediate frequency signals is between the first and second predetermined levels.

* * * * *